(12) United States Patent
Wang et al.

(10) Patent No.: US 12,119,423 B2
(45) Date of Patent: Oct. 15, 2024

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Hao Wang, Zhejiang (CN); Wenqi Li, Zhejiang (CN); Ding Yu, Zhejiang (CN); Jiahao Wu, Zhejiang (CN); Xu Liu, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/488,909

(22) Filed: Oct. 17, 2023

(65) Prior Publication Data
US 2024/0266460 A1    Aug. 8, 2024

(30) Foreign Application Priority Data

Feb. 2, 2023    (CN) .......................... 202310107821.4

(51) Int. Cl.
*H01L 31/18*    (2006.01)
*H01L 31/02*    (2006.01)
*H01L 31/0288*    (2006.01)

(52) U.S. Cl.
CPC .... *H01L 31/1868* (2013.01); *H01L 31/02008* (2013.01); *H01L 31/0288* (2013.01); *H01L 31/182* (2013.01)

(58) Field of Classification Search
CPC ........... H01L 31/1868; H01L 31/02008; H01L 31/0288
See application file for complete search history.

(56) References Cited

U.S. PATENT DOCUMENTS 10,468,486 B2    11/2019  Wu et al.
2003/0223678 A1*  12/2003  Hunter .............. H04Q 11/0005
                                                    385/17

(Continued)

FOREIGN PATENT DOCUMENTS

CN        1574398 A    2/2005
CN      109509813 A    3/2019
(Continued)

OTHER PUBLICATIONS

Zhejiang Jinko Solar Co., Ltd., et al., Extended European Search Report, EP 23202768.0, Apr. 4, 2024, 8 pgs.

*Primary Examiner* — Sadie White
(74) *Attorney, Agent, or Firm* — USCH Law, PC

(57) ABSTRACT

The solar cell includes a silicon substrate, multiple first electrodes, and multiple second electrodes. The solar cell further includes a tunneling oxide layer, multiple doped polysilicon layers, and at least one barrier layer. The at least one barrier layer is arranged between every adjacent two doped polysilicon layers in the multiple doped polysilicon layers, and the multiple first electrodes are electrically connected to different doped polysilicon layers. The solar cell provided according to the present application can reduce the total thickness of the polycrystalline silicon layer, so that a thinner polycrystalline silicon layer can reduce parasitic absorption, thereby increasing short-circuit current. Moreover, the risk of slurry burning through the tunneling oxide layer is reduced by the barrier layer, while reducing metal recombination, which increases the open circuit voltage of the solar cell, thereby improving the photoelectric conversion efficiency of the solar cell.

17 Claims, 3 Drawing Sheets

(56) References Cited

U.S. PATENT DOCUMENTS

| | | | |
|---|---|---|---|
| 2012/0247560 A1* | 10/2012 | Rim | H01L 31/02363 438/57 |
| 2015/0179838 A1* | 6/2015 | Rim | H01L 31/02167 438/96 |
| 2015/0263193 A1* | 9/2015 | Chung | H01L 31/0747 136/256 |
| 2015/0357487 A1* | 12/2015 | Schultz-Wittmann | H01L 31/1872 136/252 |
| 2015/0380599 A1* | 12/2015 | Smith | H01L 31/022441 438/97 |
| 2016/0056322 A1* | 2/2016 | Yang | H01L 31/0745 136/258 |
| 2016/0197204 A1* | 7/2016 | Lee | H01L 31/1804 136/255 |
| 2017/0005218 A1* | 1/2017 | Chang | H01L 31/022425 |
| 2019/0006534 A1* | 1/2019 | Fujita | H01L 31/02167 |
| 2020/0279970 A1* | 9/2020 | Naber | H01L 31/1868 |

FOREIGN PATENT DOCUMENTS

| | | |
|---|---|---|
| CN | 111599895 A | 8/2020 |
| CN | 113224202 A | 8/2021 |
| CN | 114038928 A | 2/2022 |
| CN | 115188835 A | 10/2022 |
| CN | 115394863 A | 11/2022 |
| CN | 115394881 A | 11/2022 |
| JP | 2015138959 A | 7/2015 |
| JP | 2022058069 A | 4/2022 |
| JP | 2022073810 A | 5/2022 |
| WO | 2012046326 A1 | 4/2012 |
| WO | 2020204823 A1 | 10/2020 |
| WO | 2022112619 A2 | 6/2022 |

\* cited by examiner

SOLAR CELL AND PHOTOVOLTAIC MODULE

CROSS-REFERENCE TO RELATED APPLICATION

The present application claims the benefit of priority under the Paris Convention to Chinese Patent Application No. 202310107821.4 filed on Feb. 2, 2023, which is incorporated herein by reference in its entirety.

TECHNICAL FIELD

Embodiments of the present application relate to the technical field of photovoltaics, and in particular to a solar cell and a photovoltaic module.

BACKGROUND

A tunnel oxide passivated contact (TOPCon) cell is prepared by a tubular low pressure chemical vapor deposition (LPCVD) device or a plasma enhanced chemical vapor deposition (PECVD) device, where a tunneling oxide layer and a doped polysilicon layer together form a passivation contact structure, which allows majority carriers to pass through the tunneling oxide layer while blocking minority carriers, so that carrier selectively transport of carriers is effectively achieved, thereby greatly reducing the recombination rate of minority carriers and improving the efficiency of the solar cell.

The TOPCon cell generally use a doped polycrystalline silicon layer with a thickness around 30 nm to achieve good passivation effect. However, due to current slurry and sintering technologies, the doped polycrystalline silicon layer needs to be around 110 to 120 nm to effectively reduce the risk of silver particles burning through the tunneling oxide layer. Furthermore, due to the strong close to-infrared light absorption of the doped polycrystalline silicon layer itself, a thicker polycrystalline silicon layer can not only bring about the loss of short-circuit current, which affects the performance of the solar cell, but also increases production costs. In summary, there is a problem of balancing light absorption and metallization of a thin polycrystalline silicon layer.

Therefore, there is an urgent to provide a solar cell, a method for preparing the same, and a photovoltaic module, to balance light absorption and metallization of a thin polycrystalline silicon layer.

SUMMARY

In view of this, in a first aspect, a solar cell is provided according to the present application, the solar cell includes a silicon substrate and a second electrode. The solar cell further includes a tunneling oxide layer formed on a surface of the silicon substrate, multiple doped polysilicon layers including at least a first doped polysilicon layer over the tunneling oxide layer and a second doped polysilicon layer over the first doped polysilicon layer. The solar cell further includes at least one barrier layer, where a respective barrier layer of the at least one barrier layer is between two respective adjacent doped polysilicon layers of the multiple doped polysilicon layers. The solar cell further includes multiple first electrodes including electrodes that are electrically connected to different doped polysilicon layers.

In an embodiment, the first doped polycrystalline silicon layer has a lower doping concentration of phosphorus element than the second doped polycrystalline silicon layer.

In an embodiment, the multiple doped polycrystalline silicon layers further include a third doped polycrystalline silicon layer. The at least one barrier layer includes a first barrier layer arranged between the first doped polycrystalline silicon layer and the second doped polycrystalline silicon layer, and a second barrier layer arranged between the second doped polycrystalline silicon layer and the third doped polycrystalline silicon layer. The first doped polycrystalline silicon layer is closer to the tunneling oxide layer than the second doped polycrystalline silicon layer, and the third doped polycrystalline silicon layer is further away from the tunneling oxide layer than both of the first doped polycrystalline silicon layer and the second doped polycrystalline silicon layer. The first doped polycrystalline silicon layer is doped with phosphorus elements, and the second doped polycrystalline silicon layer and the third doped polycrystalline silicon layer are doped with phosphorus elements, carbon elements or nitrogen elements.

In an embodiment, the multiple first electrodes include a first sub electrode and a second sub electrode, the first sub electrode is electrically connected to the third doped polycrystalline silicon layer, and the second sub electrode is electrically connected to the first doped polycrystalline silicon layer and/or the second doped polycrystalline silicon layer.

In an embodiment, the first doped polycrystalline silicon layer has a lower doping concentration of phosphorus element than the second doped polycrystalline silicon layer, and the second doped polycrystalline silicon layer has a lower doping concentration of phosphorus element than the third doped polycrystalline silicon layer.

In an embodiment, carbon elements or nitrogen elements doped in the second doped polycrystalline silicon layer and the third doped polycrystalline silicon layer are less than 5 wt %.

In an embodiment, a ratio of a doping concentration ratio of phosphorus elements in the first doped polycrystalline silicon layer to a doping concentration ratio of phosphorus elements in the third doped polycrystalline silicon layer is 0.4 to 1.

In an embodiment, a total thickness of the first doped polysilicon layer, the second doped polysilicon layer, and the third doped polysilicon layer along a direction perpendicular to the silicon substrate less than or equal to 70 nm.

In an embodiment, a thickness of the first doped polysilicon layer, a thickness of the second doped polysilicon layer, and/or a thickness of the third doped polysilicon layer along the direction perpendicular to the silicon substrate all range from 5 to 40 nm.

In an embodiment, a thickness of the first barrier layer and a thickness of the second barrier layer along a direction perpendicular to the silicon substrate both range from 0.5 to 2.5 nm.

In an embodiment, the silicon substrate includes a base region and an emitter, the emitter is formed on a surface of the base region away from the tunneling oxide layer, and a passivation layer is arranged on a surface of the emitter away from the base region. The second electrode penetrates through the passivation layer to be electrically connected to the emitter.

In a second aspect, a method for preparing a solar cell is further provided according to the present application, and the method includes: providing a silicon substrate; cleaning and texturing the silicon substrate; diffusing boron elements on the silicon substrate to form a boron doped silicon layer; removing borosilicate glass from the boron doped silicon layer, and performing alkaline polishing on a rear surface of the silicon substrate; depositing doped polycrystalline silicon layers on the rear surface of the silicon substrate layer by layer; diffusing phosphorus elements on the doped polycrystalline silicon layers, and performing annealing to crystallize the doped polycrystalline silicon layers and activate impurities; removing a part of the doped polycrystalline silicon layers formed by rolling coating of the doped polycrystalline silicon layers and borosilicate glass are from a front surface of the silicon substrate, removing phosphorus silicon glass from the rear surface of the silicon substrate, and coating both the front surface and the rear surface of the silicon substrate; printing multiple first electrodes and a second electrode on the front surface and the rear surface of the silicon substrate, respectively; and sintering the multiple first electrodes and the second electrode, where the multiple first electrodes include electrodes that are electrically connected to different doped polysilicon layers.

In a third aspect, a photovoltaic module is further provided according to the present application, the photovoltaic module includes a first encapsulation panel, a first encapsulation adhesive film, at least one cell string, a second encapsulation adhesive film, and a second encapsulation panel stacked, where the at least one cell string is formed by electrically connecting multiple solar cells according to any one of above embodiments.

Of course, any product of the present application does not necessarily need to simultaneously achieve all the technical effects described above.

By following a detailed description of the embodiments of the present application with reference to the accompanying drawings, other features and advantages of the present application will become clear.

BRIEF DESCRIPTION OF THE DRAWINGS

The accompanying drawings, which are incorporated into and form a part of the specification, illustrate embodiments of the present application and, together with their explanations, are used to explain the principles of the present application.

DETAILED DESCRIPTION

Various exemplary embodiments of the present application will be described in detail with reference to the accompanying drawings. It should be noted that unless otherwise specified, the relative arrangement, numerical expressions, and numerical values of the components and operations described in these embodiments do not limit the scope of the present application.

The following description of at least one exemplary embodiment is actually only illustrative and does not serve as any limitation on the present application or its application or usage.

The techniques, methods, and equipment known to those of ordinary skills in the art may not be discussed in detail, but in appropriate cases, the techniques, methods, and equipment should be considered as part of the specification.

In all the examples shown and discussed here, any specific values should be interpreted as merely illustrative and not as limiting. Therefore, other examples of exemplary embodiments may have different values.

It should be noted that similar labels and letters represent similar terms in the following figures, so once an item is defined in a figure, it does not need to be further discussed in subsequent figures.

Figure 1:
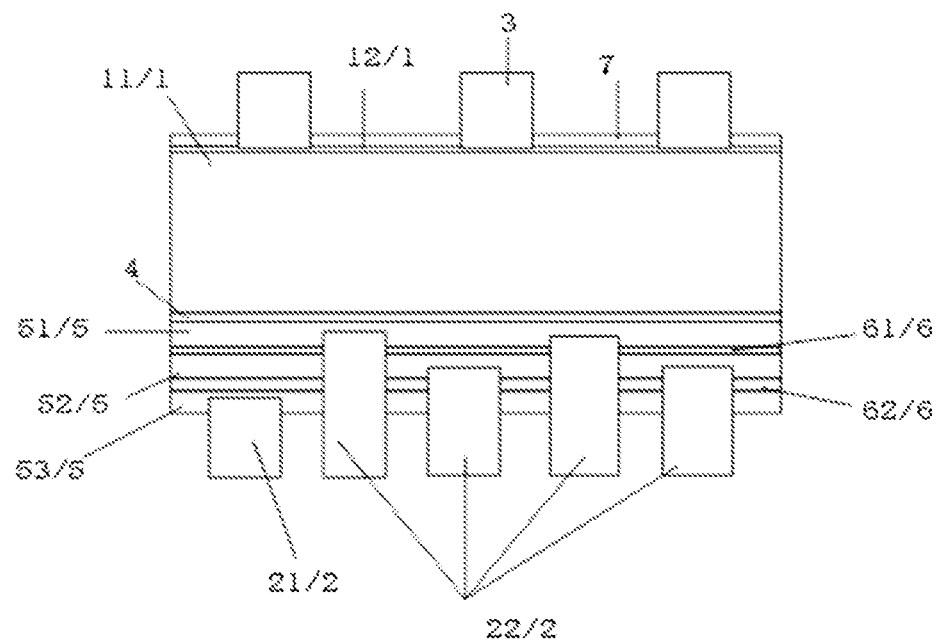
FIG. 1 is a schematic structural view of a solar cell provided according to the present application.

FIG. 1 is a schematic structural view of a solar cell provided according to the present application. As shown in FIG. 1, a solar cell is provided according to an embodiment of the present application, the solar cell includes a silicon substrate 1, multiple first electrodes 2, and a second electrode 3. The solar cell further includes a tunneling oxide layer 4 arranged on the silicon substrate 1, multiple doped polysilicon layers 5 including a first doped polysilicon layer 51 and a second doped polysilicon layer 52, and at least one barrier layer 6. The at least one barrier layer 6 is between two adjacent doped polysilicon layers 5 in the multiple doped polysilicon layers 5, and the multiple first electrodes 2 includes electrodes that are electrically connected to different doped polysilicon layers 5.

Specifically, the solar cell is a TOPCon solar cell including a silicon substrate 1, a first electrode 2, and a second electrode 3. The silicon substrate 1 is an N-type silicon substrate, and the first electrode 2 and second electrode 3 are all made of metals such as silver, aluminum, copper, nickel.

The tunneling oxide layer 4 is arranged on a surface of the silicon substrate 1 away from the silicon substrate 1. The tunneling oxide layer 4 is configured to enable majority carriers to tunnel into the doped polycrystalline silicon layer 5 while blocking the recombination of minority carriers and holes, so that electrons are collected by the metal during lateral transmission in the doped polycrystalline silicon layer 5, thereby greatly reducing the metal contact recombination current and improving the open circuit voltage and short circuit current of the TOPCon cell. The multiple doped polysilicon layers 5 are arranged on the tunneling oxide layer 4. The at least one barrier layer 6 is between two adjacent doped polysilicon layers 5 in the multiple doped polysilicon layers 5. The multiple doped polysilicon layers 5 may be three doped polysilicon layers 5, four doped polysilicon layers 5, or five doped polysilicon layers 5. Preferably, three doped polysilicon layers 5 are arranged on the surface of the tunneling oxide layer 4 away from the silicon substrate 1, and two barrier layers 6 are arranged between two adjacent doped polysilicon layers 5. The barrier layer 6 is denser than the doped polycrystalline silicon layer 5, so that the barrier layer 6 can provide a blocking effect. Specifically, the barrier layer 6 can prevent the slurry (e.g., silver particles) from burning through the tunneling oxide layer 4 without affecting transmission of electrons. The material of the barrier layer 6 includes but is not limited to silicon oxide, silicon nitride oxide, and aluminum oxide.

Multiple first electrodes 2 are electrically connected to different doped polysilicon layers 5. For example, some of the first electrodes 2 are formed to reach the outermost doped polysilicon layer 5 (farthest away from the tunneling oxide layer 4), some of the first electrodes 2 are formed to reach the innermost doped polysilicon layer 5 (closest to the tunneling oxide layer 4), and some of the first electrodes 2 are formed to reach the doped polysilicon layers 5 between the innermost doped polysilicon layer 5 and the outermost layers doped polysilicon layer 5. Due to the presence of a barrier layer 6, the risk of the tunneling oxide layer 4 being burned through is reduced as much as possible, which avoids affecting the open circuit voltage, filling factor, and conversion efficiency of the TOPCon cell.

The silicon substrate 1 includes a base region 11 and an emitter 12. The emitter 12 is arranged on a surface of the base region 11 away from the tunneling oxide layer 4, and a passivation layer 7 is arranged on a surface of the emitter 12 away from the base region 11. The second electrode 3 penetrates through the passivation layer 7 to be electrically connected to the emitter 12.

From the above embodiments, it can be seen that the solar cell provided according to this embodiment has achieved at least the following beneficial effects.

The solar cell provided according to the embodiments of the present application includes a silicon substrate 1, multiple first electrodes 2, and a second electrode 3. The solar cell further includes a tunneling oxide layer 4 arranged on a surface of the silicon substrate 1 away from the silicon substrate 1, multiple doped polysilicon layers 5 arranged on a surface of the tunneling oxide layer, and at least one barrier layer 6. The at least one barrier layer 6 is between two adjacent doped polysilicon layers 5 in the multiple doped polysilicon layers 5, and the multiple first electrodes 2 are electrically connected to different doped polysilicon layers 5. By adopting the above solution, the overall problem of balancing light absorption and metallization of a thin polycrystalline silicon layer has been solved. Specifically, the solar cell provided according to the present application can reduce the total thickness of the polycrystalline silicon layer, so that a thinner polycrystalline silicon layer can reduce parasitic absorption, thereby increasing short-circuit current. Moreover, the risk of slurry burning through the tunneling oxide layer 4 is reduced by the barrier layer 6, while reducing metal recombination, which increases the open circuit voltage of the solar cell, thereby improving the photoelectric conversion efficiency of the solar cell.

In an embodiment, reference is made back to FIG. 1. The first doped polycrystalline silicon layer 51 has a lower doping concentration of phosphorus element than the second doped polysilicon layer 52, which not only ensures good passivation effect of the solar cell, but also reduces the risk of phosphorus elements penetrating into the silicon substrate 1. The open circuit and short-circuit current is effectively improved, while ensuring good contact between the solar cell and the slurry and reducing contact resistance, thereby improving the filling factor of the solar cell. Specifically, the doping concentration of phosphorus elements in doped polycrystalline silicon layer 5 closest to the silicon substrate 1 ranges from $2\times10^{20}$/cm3 to $2\times10^{21}$/cm3. Specifically, the doping concentration of phosphorus elements in doped polycrystalline silicon layer 5 closest to the silicon substrate 1 may be $2\times10^{20}$/cm3, $11\times10^{20}$/cm3 or $2\times10^{21}$/cm3. The doping concentration of phosphorus elements in the doped polycrystalline silicon layer 5 farthest away from the silicon substrate 1 may be $5\times10^{20}$/cm3 to $5\times10^{21}$/cm3. Specifically, the doping concentration of phosphorus elements in the doped polycrystalline silicon layer 5 farthest away from the silicon substrate 1 may be $5\times10^{20}$/cm3, $27.5\times10^{20}$/cm3 or $5\times10^{21}$/cm3.

In an embodiment, reference is made back to FIG. 1. The multiple doped polysilicon layers 5 further include a third doped polysilicon layer 53. The at least one barrier layer 6 includes a first barrier layer 61 arranged between the first doped polycrystalline silicon layer 51 and the second doped polycrystalline silicon layer 52, and a second barrier layer 62 arranged between the second doped polycrystalline silicon layer 52 and the third doped polycrystalline silicon layer 53. The first doped polycrystalline silicon layer 51 is arranged closest to the tunneling oxide layer 4, and the third doped polycrystalline silicon layer 53 is arranged farthest away from the tunneling oxide layer 4.

The first doped polycrystalline silicon layer 51 is doped with phosphorus elements, and the second doped polycrystalline silicon layer 52 and the third doped polycrystalline silicon layer 53 are doped with phosphorus elements, carbon elements or nitrogen elements, respectively. That is to say, the first doped polycrystalline silicon layer 51, the second doped polycrystalline silicon layer 52, and the third doped polycrystalline silicon layer 53 are all doped with phosphorus elements. The second doped polycrystalline silicon layer 52 and the third doped polycrystalline silicon layer 53 are both further doped with carbon elements or nitrogen elements, which can increase the optical gap and reduce parasitic absorption. Of course, according to the actual situation, the second doped polycrystalline silicon layer 52 may only be doped with phosphorus elements without carbon elements or nitrogen elements, while the third doped polycrystalline silicon layer 53 can also increase the optical gap and reduce parasitic absorption by doping carbon elements or nitrogen elements on the basis of phosphorus elements.

In one embodiment, reference is made back to FIG. 1, the first electrode 2 includes a first sub electrode 21 and a second sub electrode 22. The first sub electrode 21 is electrically connected to the third doped polycrystalline silicon layer 53, and the second sub electrode 22 is electrically connected to the first doped polycrystalline silicon layer 51 and/or the second doped polycrystalline silicon layer 52.

Specifically, the first electrode 2 includes a first sub electrode 21 and a second sub electrode 22, where the first sub electrode 21 is electrically connected to the third doped polysilicon layer 53, the second sub electrode 22 is electrically connected to the second doped polysilicon layer 52, or the second sub electrode 22 is electrically connected to the first doped polysilicon layer 51, or part of the second sub electrodes 22 are electrically connected to the second doped polysilicon layer 52, and another part of the second sub electrode 22 is electrically connected to the first doped polysilicon layer 51, which effectively reduces metal recombination, and increases the open circuit voltage of the solar cell, and thereby improving the photoelectric conversion efficiency of the solar cell.

In an embodiment, reference is made back to FIG. 1. The first doped polycrystalline silicon layer 51 has a lower doping concentration of phosphorus element than the second doped polycrystalline silicon layer 52, and the second doped polycrystalline silicon layer 52 has a lower doping concentration of phosphorus element than the third doped polycrystalline silicon layer 53.

Specifically, the doping concentration of phosphorus elements in the first doped polycrystalline silicon layer 51, the second doped polycrystalline silicon layer 52, and the third doped polycrystalline silicon layer 53 gradually increases. Specifically, the doping concentration of phosphorus elements in the first doped polycrystalline silicon layer 51 is low, which can reduce the risk of phosphorus element penetrating into the interior of the solar cell and ensure good passivation effect. The doping concentration of phosphorus elements in the third doped polycrystalline silicon layer 53 is relatively high, which can ensure good contact between the solar cell and the slurry, reduce contact resistance, and improve the filling factor of the solar cell. The doping concentration of phosphorus in the second doped polycrystalline silicon layer 52 is between the doping concentration of phosphorus in the first doped polycrystalline silicon layer 51 and the doping concentration of phosphorus in the third doped polycrystalline silicon layer 53.

In an embodiment, reference is made back to FIG. 1. Carbon elements or nitrogen elements doped in the second doped polycrystalline silicon layer 52 and the third doped polycrystalline silicon layer 53 are less than 5 wt %.

Specifically, in response to carbon elements or nitrogen elements doped in the second doped polycrystalline silicon layer 52 and the third doped polycrystalline silicon layer 53 being greater than 5 wt %, transmission of electrons and passivation effect are affected, thereby affecting the efficiency of the solar cell. Therefore, in response to carbon elements or nitrogen elements doped in the second doped polycrystalline silicon layer 52 and the third doped polycrystalline silicon layer 53 being less than 5 wt %, it is beneficial for transmission of electrons and passivation effect, thereby improving the efficiency of the solar cell. Optionally, carbon elements and nitrogen elements are doped in the third doped polycrystalline silicon layer 53. Specifically, the carbon elements and nitrogen elements doped in the second doped polycrystalline silicon layer 52 and the third doped polycrystalline silicon layer 53 may be 0.01 wt %, 1 wt %, 2 wt %, 3 wt %, 4 wt %, or 5 wt %.

In an embodiment, reference is made back to FIG. 1. A ratio of a doping concentration ratio of phosphorus elements in the first doped polycrystalline silicon layer 51 to a doping concentration ratio of phosphorus elements in the third doped polycrystalline silicon layer 53 is 0.4 to 1.

Specifically, in response to the ratio of a doping concentration ratio of phosphorus elements in the first doped polycrystalline silicon layer 51 to a doping concentration ratio of phosphorus elements in the third doped polycrystalline silicon layer 53 being less than 0.4, the doping concentration of phosphorus elements in the third doped polycrystalline silicon layer 53 is too high, resulting in severe Auger recombination, which affects the short circuit current and passivation effect of the solar cell, and thus affecting the efficiency of the solar cell. In response to the ratio of a doping concentration ratio of phosphorus elements in the first doped polycrystalline silicon layer 51 to a doping concentration ratio of phosphorus elements in the third doped polycrystalline silicon layer 53 being greater than 1, the doping concentration of phosphorus elements in the third doped polycrystalline silicon layer 53 is too low, the contact resistance is high, and the filling factor of the solar cell is reduced, which affects the efficiency of the solar cell. Therefore, the ratio of a doping concentration ratio of phosphorus elements in the first doped polycrystalline silicon layer 51 to a doping concentration ratio of phosphorus elements in the third doped polycrystalline silicon layer 53 is arranged between 0.4 to 1, which can not only avoid high phosphorus doping concentration in the third doped polycrystalline silicon layer 53, thereby reducing Auger recombination, improving the short-circuit current and passivation effect of the solar cell, but also prevents low phosphorus doping concentration in the third doped polycrystalline silicon layer 53, so that the contact resistance is reduced, and the filling factor of the solar cell is improved, thereby improving the efficiency of the solar cell. Specifically, the ratio of a doping concentration ratio of phosphorus elements in the first doped polycrystalline silicon layer 51 to a doping concentration ratio of phosphorus elements in the third doped polycrystalline silicon layer 53 may be 0.4, 0.5, 0.6, 0.7, 0.8, 0.9 or 1.

In an embodiment, reference is made back to FIG. 1. The total thickness of the first doped polysilicon layer 51, the second doped polysilicon layer 52, and the third doped polysilicon layer 53 along a direction perpendicular to the silicon substrate 1 less than or equal to 70 nm.

Specifically, along the direction perpendicular to the silicon substrate 1, in response to the total thickness of the first doped polysilicon layer 51, the second doped polysilicon layer 52, and the third doped polysilicon layer 53 being more than 70 nm, it is not possible to reduce the total thickness of the polysilicon layer and improve the parasitic absorption of light. Therefore, the total thickness of the first doped polysilicon layer 51, the second doped polysilicon layer 52, and the third doped polysilicon layer 53 along a direction perpendicular to the silicon substrate 1 are arranged to be less than or equal to 70 nm, which can reduce the total thickness of the multiple polycrystalline silicon layers, reduce parasitic absorption of light, and reduce production costs. Specifically, along the direction perpendicular to the silicon substrate 1, the total thickness of the first doped polycrystalline silicon layer 51, the second doped polycrystalline silicon layer 52, and the third doped polycrystalline silicon layer 53 may be 60 nm, 65 nm, or 70 nm.

In an embodiment, reference is made back to FIG. 1. A thickness of the first doped polysilicon layer 51, a thickness of the second doped polysilicon layer 52, and/or a thickness of the third doped polysilicon layer 53 along the direction perpendicular to the silicon substrate 1 all range from 5 to 40 nm.

Specifically, in response to the thickness of the first doped polysilicon layer 51, the thickness of the second doped polysilicon layer 52, and/or the thickness of the third doped polysilicon layer 53 along the direction perpendicular to the silicon substrate 1 being less than 5 nm, there is a risk of slurry burning through the tunneling oxide layer 4. In addition, the uniformity of the multiple doped polycrystalline silicon layers is difficult to control. In response to the thickness of the first doped polysilicon layer 51, the thickness of the second doped polysilicon layer 52, and/or the thickness of the third doped polysilicon layer 53 along the direction perpendicular to the silicon substrate 1 being greater than 40 nm, which increases production costs. Therefore, response to the thickness of the first doped polysilicon layer 51, the thickness of the second doped polysilicon layer 52, and/or the thickness of the third doped polysilicon layer 53 along the direction perpendicular to the silicon substrate 1 is arranged to between 5 nm to 40 nm, which can not only reduce the risk of the slurry burning through the tunneling oxide layer 4, it is but also beneficial to control the uniformity of the multiple doped polycrystalline silicon layers while reducing production costs. Specifically, the thickness of the first doped polycrystalline silicon layer 51 along the direction perpendicular to silicon substrate 1 may be 40 nm, 35 nm, 30 nm, 25 nm, 20 nm, 15 nm, 10 nm or 5 nm. The thickness of the second doped polycrystalline silicon layer 52 along the direction perpendicular to silicon substrate 1 may be 40 nm, 30 nm, 20 nm, 10 nm, or 5 nm. The thickness of the third doped polycrystalline silicon layer 53 along the direction perpendicular to silicon substrate 1 may be 5 nm. 10 nm, 20 nm, 30 nm or 40 nm. Optionally, the thickness of the first doped polycrystalline silicon layer 51 may be 40 nm, the thickness of the second doped polycrystalline silicon layer 52 may be 25 nm, and the thickness of the third doped polycrystalline silicon layer 53 may be 5 nm. Alternatively, the thickness of the first doped polycrystalline silicon layer 51 may be 35 nm, the thickness of the second doped polycrystalline silicon layer 52 may be 30 nm, and the thickness of the third doped polycrystalline silicon layer 53 may be 5 nm. Alternatively, the thickness of the first doped polycrystalline silicon layer 51 may be 30 nm, the thickness of the second doped polycrystalline silicon layer 52 may be 30 nm, and the thickness of the third doped polycrystalline silicon layer 53 may be 10 nm.

In an embodiment, reference is made back to FIG. 1. A thickness of the first barrier layer 61 and a thickness of the second barrier layer 62 along a direction perpendicular to the silicon substrate 1 both range from 0.5 to 2.5 nm.

Specifically, in response to the thickness of the first barrier layer 61 and the thickness of the second barrier layer 62 along the direction perpendicular to the silicon substrate 1 being less than 0.5 nm, the thickness of the first barrier layer 61 and the thickness the second barrier layer 62 are too thin, which makes it difficult to control uniformity in the production process, so that the effect of blocking the slurry from burning through will be poor. In response to the thickness of the first barrier layer 61 and the thickness of the second barrier layer 62 along the direction perpendicular to the silicon substrate 1 being greater than 2.5 nm, which will affect transmission of electrons and seriously affects the filling factor of the solar cell. Therefore, the thickness of the first barrier layer 61 and the thickness of the second barrier layer 62 along the direction perpendicular to the silicon substrate 1 are both arranged between 0.5 nm to 2.5 nm, respectively, which can not only prevent the thickness of the first barrier layer 61 and the second barrier layer 62 from being too thin, it is beneficial for controlling the uniformity of the first barrier layer 61 and the second barrier layer 62 in the process, as well as for electron transmission and improving the filling factor of the solar cell. Specifically, the thickness of the first barrier layer 61 along the direction perpendicular to the silicon substrate 1 may be 0.5 nm, 1 nm, 1.5 nm, 2 nm or 2.5 nm. The thickness of the second barrier layer 62 along the direction perpendicular to the silicon substrate 1 may be 0.5 nm, 1 nm, 1.5 nm, 2 nm, or 2.5 nm.

Figure 2:
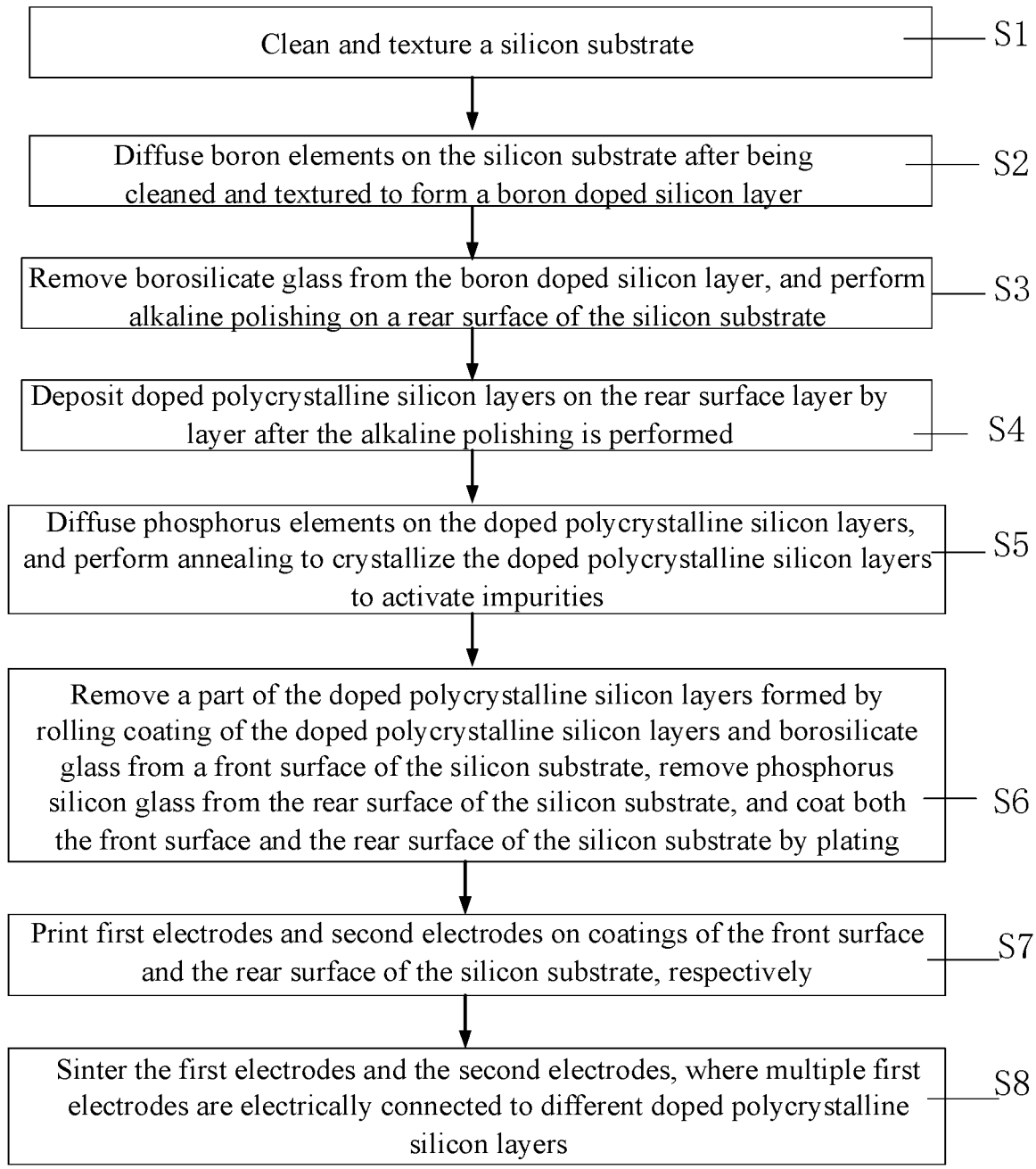
FIG. 2 is a flowchart of a method for preparing a solar cell provided according to the present application.

FIG. 2 is a flowchart of a method for preparing a solar cell provided according to the present application. Reference is made to FIG. 1 and FIG. 2, a method for preparing a solar cell is provided according to the embodiments of the present application. The method includes the following operations S1 to S8.

In operation S1, the silicon substrate 1 is cleaned and textured.

In operation S2, boron elements are diffused on the silicon substrate 1 after being cleaned and textured to form a boron doped silicon layer.

In operation S3, borosilicate glass is removed from the boron doped silicon layer, and alkaline polishing is performed on the rear surface of the silicon substrate 1.

In operation S4, doped polycrystalline silicon layers 5 are deposited on the rear surface layer by layer after the alkaline polishing is performed.

In operation S5, phosphorus elements are diffused on the doped polycrystalline silicon layers 5, and annealing is performed to crystallize the doped polycrystalline silicon layers 5 and activate impurities.

In operation S6, a part of the doped polycrystalline silicon layers formed by rolling coating of the doped polycrystalline silicon layers and borosilicate glass are removed from the front surface of the silicon substrate 1, phosphorus silicon glass is removed from the rear surface of the silicon substrate 1, and both the front surface and the rear surface of the silicon substrate 1 are coated.

In operation S7, the first electrodes 2 and the second electrodes 3 are printed on coatings of the front surface and the rear surface of the silicon substrate 1, respectively;

In operation S8, the first electrodes 2 and the second electrodes 3 are sintered, where multiple first electrodes 2 are electrically connected to different doped polycrystalline silicon layers 5.

Specifically, a method for preparing a solar cell is further provided according to the embodiments of the present application. The method is a method for preparing a TOP-Con cell. A N-type monocrystalline silicon wafer with a resistivity range of 0.3 to 2.1 Ohm·cm and a minority carrier lifetime more than 2.5 ms is selected. A sacrificial layer on a surface of the silicon wafer is removed in a mixed solution of KOH and $H_2O_2$, and the silicon wafer is textured in the KOH solution. The textured surfaces of the silicon wafer are textured in shape of pyramid with a size controlled at 1 to 5 μm. After texturing is completed, boron elements are diffused on a front surface of the silicon wafer to form an emitter with a square resistance of 110 to 150 Ohm·cm. The thickness of the borosilicate glass on the front surface ranges from 50 to 120 nm. After the borosilicate glass on the rear surface of the silicon wafer is removed, alkali polishing is carried out to achieve a reflectivity of more than 40% on the rear surface of the silicon wafer. After alkaline polishing is performed, a LPCVD device is used to deposit doped polysilicon layers 5 on the polished surface. After the doped polysilicon layers 5 are deposited, the polysilicon is directly doped using phosphorus diffusion equipment and directly annealed with phosphorus diffusion equipment to crystallize the polysilicon and promote and activate impurities (P). The annealing process conditions are: annealing at 800-1000 degrees Celsius for 10 to 150 minutes in nitrogen ($N_2$) or $N_2$ in the early stage and oxygen ($O_2$) in the later stage, followed by cleaning after annealing. Alternatively, a PECVD device is used to deposit doped polysilicon layers, phosphorus doping is synchronously carried out during the deposition of doped polysilicon, followed by annealing to crystallize the polysilicon and promote and activate impurities (P). After annealing, a part of the doped polycrystalline silicon layers formed by rolling coating of the doped polycrystalline silicon layers and borosilicate glass are removed from the front surface, phosphorus silicon glass is removed from the rear surface, and cleaning is performed again. After cleaning, the front surface and the rear surface are coated, such as depositing an aluminum oxide layer on the front surface of the silicon wafer using an atomic layer deposition (ALD) device and preparing a silicon nitride layer using a PECVD device. A first passivation layer is deposited on the rear surface of the silicon wafer to complete the preconditions of the solar cell. After surface passivation is completed, metallization is carried out on the front surface and the rear surface of the silicon wafer. The first electrodes 2 and the second electrodes 3 are printed on the rear surface of the silicon wafer using screen printing. Due to the different sizes and shapes of the slurry (silver particles), the depth of each first electrode 2 burned into the doped polycrystalline silicon layer 5 is also different. For example, multiple first electrodes 2 are electrically connected to different doped polycrystalline silicon layers 5. After the first electrodes 2 and the second electrodes 3 are printed, the first electrodes 2 are burned into the doped polycrystalline silicon layer 5 at a high temperature of 850 degrees Celsius to 950 degrees Celsius, the second electrodes 3 are burned to be electrically connected to the emitter, so that the solar cell is prepared.

From the above embodiments, it can be seen that the method for preparing the solar cell provided according to the embodiments of the present application has achieved at least the following beneficial effects.

In the method for preparing the solar cell provided according to the embodiments of the present application, the silicon substrate 1 is cleaned and textured. Boron diffusion is carried out on the silicon substrate 1 after texturing to form boron doped silicon layers. The borosilicate glass is removed from a boron doped silicon layer, and alkaline polishing is performed on the rear surface of the silicon substrate 1. After alkali polishing, doped polycrystalline silicon layers 5 are deposited on the rear surface layer by layer. A part of the doped polycrystalline silicon layers formed by rolling coating of the doped polycrystalline silicon layers is removed, and liquid dopant containing phosphorus is applied on the rear surface. Drying is performed afterwards. The dried liquid dopant containing phosphorus is annealed to crystallize the doped polycrystalline silicon layer 5 and activate impurities. After annealing, both the front surface and the rear surface are coated. The first electrodes 2 and the second electrodes 3 are printed on coatings of the front surface and the rear surface, respectively. After the first electrodes 2 and the second electrodes 3 are printed, sintering is carried out. Among them, multiple first electrodes 2 are electrically connected to different doped polycrystalline silicon layers 5. By adopting the above scheme, metal recombination can be reduced, which improves the open circuit voltage of the solar cell, and thereby improving the photoelectric conversion efficiency of the solar cell.

In an embodiment, reference is made back to FIG. 1. After alkali polishing, an operation of depositing the doped polycrystalline silicon layers 5 on the rear surface layer by layer includes: preparing a tunneling oxide layer 4 and depositing a first doped polycrystalline silicon layer 51, preparing a first barrier layer 61 and depositing a second doped polycrystalline silicon layer 52, and preparing a second barrier layer 62 and depositing a third doped polycrystalline silicon layer 53.

Specifically, stacked doped polycrystalline silicon layers 5 is deposited using a PECVD device at a deposition temperature of 350 to 480 degrees Celsius and a power range of 6000 w to 15000w. The tunneling oxide layer 4 grows by using laughing gas ($N_2O$) with a process time of 10 to 60 seconds., the first doped polycrystalline silicon layer 51 grows in situ by using a mixture of phosphine (PH3) and silane (SiH4) with a process time of 100 to 300 seconds. After growing the first doped polycrystalline silicon layer 51, the first barrier layer 61 grows by using N2O with a process time of 10 to 60 seconds. Alternatively, a mixture of SiH4, N2O, and NH3 may be used to grow the first barrier layer 61 with a process time of 1 to 10 seconds. After growing the first barrier layer 61, the second doped polysilicon layer 52, the second barrier layer 62, and the third doped polysilicon layer 53 grow in the above manner. For growing the second doped polysilicon layer 52 and/or the third doped polysilicon layer 53, a mixture of PH3, SiH4, and CH4 (or NH3) may be used for growth with a process time of 30 to 300 seconds. By adopting the above scheme, the total thickness of the polysilicon layers can be reduced. A thinner polycrystalline silicon layer can reduce parasitic absorption, thereby increasing short-circuit current, and reduce the risk of slurry being burned through the tunneling oxide layer 4 by the barrier layer 6.

In an embodiment, reference is made back to FIG. 1. The first electrode 2 includes a first sub electrode 21 and a second sub electrode 22. The first sub electrode 21 is electrically connected to the third doped polycrystalline silicon layer 53, and the second sub electrode 22 is electrically connected to the first doped polycrystalline silicon layer 51 and/or the second doped polycrystalline silicon layer 52. The first electrode 2 has been elaborated in detail in the solar cell provided according to the embodiments of the present application and will not be further elaborated here.

Figure 3:
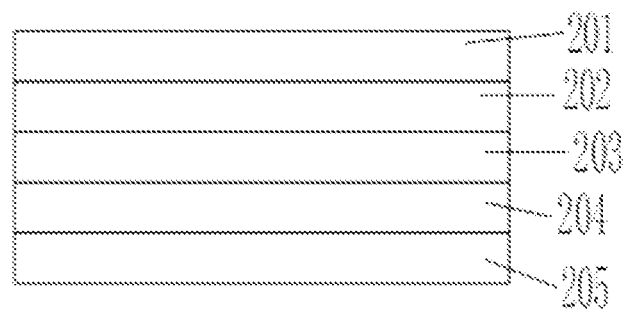
FIG. 3 is a schematic structural view of a photovoltaic module provided according to the present application.

FIG. 3 is a schematic structural view of a photovoltaic module provided according to the present application. Referring to FIG. 3, a photovoltaic module is provided according to the embodiments of the present application, the photovoltaic module includes a first encapsulation panel 201, a first encapsulation adhesive film 202, at least one cell string 203, a second encapsulation adhesive film 204, and a second encapsulation panel 205 arranged in sequence. The at least one cell string 203 is formed by electrically connecting multiple solar cells according the above embodiments.

Specifically, the photovoltaic module includes a first encapsulation panel 201, a first encapsulation adhesive film 202, at least one cell string 203, a second encapsulation adhesive film 204, and a second encapsulation panel 205 arranged in a stacked manner. The at least one cell string 203 is formed by electrically connecting multiple solar cells according the above embodiments. The first encapsulation panel 201 may be made of tempered glass, which has a high light transmittance and can reach a light transmittance of over 92%. Generally, low iron tempered embossed glass is used. The second encapsulation panel 205 may be made of glass material, a polytetrafluoroethylene composite film including tedlar (e.g., one of polytetrafluoroethylene product), polyethylene terephthalate, and tedlar (TPT) or a thermoplastic elastomer (TPE). The second encapsulation panel 205 is configured to protect the internal encapsulation material and the solar cell from mechanical damage and external environmental corrosion, and also has good insulation performance, which largely determines the working life of the photovoltaic module. The second encapsulation panel 205 has excellent weather resistance, low water vapor permeability, good electrical insulation, and a certain bonding strength. The first encapsulation film 202 and the second encapsulation film 204 includes ethylene vinyl acetate copolymer (EVA), ethylene and high carbon α-Random copolymer elastomers of olefins (POE) or polyvinyl butyraldehyde (PVB). Due to the introduction of vinyl acetate monomer into the molecular chain, EVA material can reduce high crystallinity, improve toughness, impact resistance, filler solubility, and thermal sealing performance. The molecular structure of POE material endows it with excellent mechanical properties, rheological properties, and UV resistance, as well as good affinity with polyolefins, good low-temperature toughness, and high cost-effectiveness. PVB material is soluble in solvents such as methanol, ethanol, ketones, halogenated alkanes, and aromatic hydrocarbons. In addition, PVB material has good compatibility with phthalates, sebacate benzene plasticizers, cellulose nitrate, phenolic resin, and epoxy resin. PVB material has high transparency, cold resistance, impact resistance, UV radiation resistance, and good adhesion with metals, glass, wood, ceramics, fiber products, etc. The first encapsulation adhesive film 202 and the second encapsulation adhesive film 204 are configured to encapsulate and protect the solar cell from the external environment. The first encapsulation panel 201, the solar cell, and second encapsulation panel 205 are bonded together, with a certain bonding strength, high transmittance, reasonable cross-linking degree, excellent UV aging resistance, moisture and heat aging resistance, and extremely low shrinkage rate, which has long-term strong bonding performance and high-volume resistivity for various first encapsulation panels 201 and second encapsulation panels 205. The at least one cell string 203 is formed by electrically connecting multiple solar cells (not shown in figures) according the above embodiments, and two adjacent solar cells are electrically connected by a welding strip (not shown in figures).

From the above embodiments, it can be seen that the solar cell, the method for preparing the solar cell, and the photovoltaic module provided according to the embodiments of the present application has achieved at least the following beneficial effects.

The solar cell, the method for preparing the solar cell, and the photovoltaic module are provided according to the embodiments of the present application. The solar cell includes a silicon substrate 1, multiple first electrodes 2, and a second electrode 3. The solar cell further includes a tunneling oxide layer 4 arranged on a surface of the silicon substrate 1 away from the silicon substrate 1, multiple doped polysilicon layers 5 arranged on a surface of the tunneling oxide layer 4 away from the silicon substrate 1, and at least one barrier layer 6. The at least one barrier layer 6 is between two adjacent doped polysilicon layers 5 in the multiple doped polysilicon layers 5, and the multiple first electrodes 2 includes electrodes that are electrically connected to different doped polysilicon layers 5. By adopting the above solution, the overall problem of balancing light absorption and metallization of a thin polycrystalline silicon layer has been solved. Specifically, the solar cell provided according to the present application can reduce the total thickness of the polycrystalline silicon layer, so that a thinner polycrystalline silicon layer can reduce parasitic absorption, thereby increasing short-circuit current. Moreover, the risk of slurry burning through the tunneling oxide layer 4 is reduced by the barrier layer 6, while reducing metal recombination, which increases the open circuit voltage of the solar cell, thereby improving the photoelectric conversion efficiency of the solar cell.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present application is disclosed above with preferred embodiments, it is not used to limit the claims. The scope of protection shall be subject to the scope defined by the claims of the present application. In addition, the embodiments and the accompanying drawings in the specification of the present application are only illustrative examples, which will not limit the scope protected by the claims of the present application.

What is claimed is:

1. A solar cell, comprising:
   a silicon substrate;
   a tunneling oxide layer formed on the silicon substrate;
   a plurality of doped polysilicon layers including a first doped polysilicon layer over the tunneling oxide layer, a second doped polysilicon layer over the first doped polysilicon layer, and a third doped polycrystalline silicon layer;
   at least one barrier layer, wherein the at least one barrier layer is between two adjacent doped polysilicon layers of the plurality of doped polysilicon layers, and the at least one barrier layer is denser than the plurality of doped polysilicon layers; and
   a plurality of first electrodes, the plurality of first electrodes including electrodes that are electrically connected to different doped polysilicon layers;
   wherein the at least one barrier layer comprises a first barrier layer arranged between the first doped polycrystalline silicon layer and the second doped polycrystalline silicon layer, and a second barrier layer arranged between the second doped polycrystalline silicon layer and the third doped polycrystalline silicon layer;
   wherein the first doped polycrystalline silicon layer is arranged closer to the tunneling oxide layer than the second doped polycrystalline silicon layer, and the third doped polycrystalline silicon layer is further away from the tunneling oxide layer than both the first doped polycrystalline silicon layer and the second doped polycrystalline silicon layer;
   wherein the first doped polycrystalline silicon layer is doped with phosphorus elements, and the second doped polycrystalline silicon layer and the third doped polycrystalline silicon layer are doped with phosphorus elements, and further doped with carbon elements or nitrogen elements.

2. The solar cell according to claim 1, wherein the first doped polycrystalline silicon layer has a lower doping concentration of phosphorus element than the second doped polycrystalline silicon layer.

3. The solar cell according to claim 1, wherein the plurality of first electrodes comprise a first sub electrode and a second sub electrode, the first sub electrode is electrically connected to the third doped polycrystalline silicon layer, and the second sub electrode is electrically connected to the first doped polycrystalline silicon layer and/or the second doped polycrystalline silicon layer.

4. The solar cell according to claim 1, wherein the first doped polycrystalline silicon layer has a lower doping concentration of phosphorus element than the second doped polycrystalline silicon layer, and the second doped polycrystalline silicon layer has a lower doping concentration of phosphorus element than the third doped polycrystalline silicon layer.

5. The solar cell according to claim 1, wherein carbon elements or nitrogen elements doped in the second doped polycrystalline silicon layer and the third doped polycrystalline silicon layer are less than 5 wt %.

6. The solar cell according to claim 1, wherein a ratio of a doping concentration ratio of phosphorus elements in the first doped polycrystalline silicon layer to a doping concentration ratio of phosphorus elements in the third doped polycrystalline silicon layer is 0.4 to 1.

7. The solar cell according to claim 1, wherein a total thickness of the first doped polysilicon layer, the second doped polysilicon layer, and the third doped polysilicon layer along a direction perpendicular to the silicon substrate less than or equal to 70 nm.

8. The solar cell according to claim 7, wherein a thickness of the first doped polysilicon layer, a thickness of the second doped polysilicon layer, and/or a thickness of the third doped polysilicon layer along the direction perpendicular to the silicon substrate all range from 5 to 40 nm.

9. The solar cell according to claim 1, wherein a thickness of the first barrier layer and a thickness of the second barrier layer along a direction perpendicular to the silicon substrate both range from 0.5 to 2.5 nm.

10. The solar cell according to claim 1, further comprising a plurality of second electrodes, wherein the silicon substrate comprises a base region and an emitter, the emitter is formed on a surface of the base region away from the tunneling oxide layer, and a passivation layer is arranged on a surface of the emitter away from the base region;
wherein the plurality of second electrodes penetrate through the passivation layer to be electrically connected to the emitter.

11. The solar cell according to claim 1, wherein a material of the at least one barrier layer comprises silicon oxide, silicon nitride oxide, and aluminum oxide.

12. The solar cell according to claim 2, wherein the doping concentration of phosphorus elements in doped polycrystalline silicon layer closest to the silicon substrate ranges from $2\times10^{20}$/cm3 to $2\times10^{21}$/cm3.

13. The solar cell according to claim 12, wherein the doping concentration of phosphorus elements in the doped polycrystalline silicon layer farthest away from the silicon substrate ranges from $5\times10^{20}$/cm3 to $5\times10^{21}$/cm3.

14. The solar cell according to claim 6, wherein the ratio of the doping concentration ratio of phosphorus elements in the first doped polycrystalline silicon layer to the doping concentration ratio of phosphorus elements in the third doped polycrystalline silicon layer is 0.4, 0.5, 0.6, 0.7, 0.8, 0.9 or 1.

15. A photovoltaic module, comprising a first encapsulation panel, a first encapsulation adhesive film, at least one cell string, a second encapsulation adhesive film, and a second encapsulation panel that are stacked, wherein the at least one cell string is formed by electrically connecting a plurality of solar cells;
wherein each of the plurality of solar cells includes:
a silicon substrate;
a tunneling oxide layer formed on the silicon substrate;
a plurality of doped polysilicon layers including a first doped polysilicon layer over the tunneling oxide layer, a second doped polysilicon layer over the first doped polysilicon layer, and a third doped polysilicon layer;
at least one barrier layer, wherein the at least one barrier layer is between two adjacent doped polysilicon layers of the plurality of doped polysilicon layers, and the at least one barrier layer is denser than the plurality of doped polysilicon layers; and
a plurality of first electrodes, the plurality of first electrodes including electrodes that are electrically connected to different doped polysilicon layers;
wherein the at least one barrier layer comprises a first barrier layer arranged between the first doped polycrystalline silicon layer and the second doped polycrystalline silicon layer, and a second barrier layer arranged between the second doped polycrystalline silicon layer and the third doped polycrystalline silicon layer;
wherein the first doped polycrystalline silicon layer is arranged closer to the tunneling oxide layer than the second doped polycrystalline silicon layer, and the third doped polycrystalline silicon layer is further away from the tunneling oxide layer than both the first doped polycrystalline silicon layer and the second doped polycrystalline silicon layer;
wherein the first doped polycrystalline silicon layer is doped with phosphorus elements, and the second doped polycrystalline silicon layer and the third doped polycrystalline silicon layer are doped with phosphorus elements, and further doped with carbon elements or nitrogen elements.

16. The photovoltaic module according to claim 15, wherein the first doped polycrystalline silicon layer has a lower doping concentration of phosphorus element than the second doped polycrystalline silicon layer.

17. The photovoltaic module according to claim 15, wherein the plurality of first electrodes comprise a first sub electrode and a second sub electrode, the first sub electrode is electrically connected to the third doped polycrystalline silicon layer, and the second sub electrode is electrically connected to the first doped polycrystalline silicon layer and/or the second doped polycrystalline silicon layer.

* * * * *